US012006571B2

(12) United States Patent
Lin et al.

(10) Patent No.: US 12,006,571 B2
(45) Date of Patent: *Jun. 11, 2024

(54) ATOMIC LAYER DEPOSITION APPARATUS FOR COATING ON FINE POWDERS

(71) Applicant: SKY TECH INC., Hsinchu County (TW)

(72) Inventors: Jing-Cheng Lin, Hsinchu County (TW); Ching-Liang Yi, Hsinchu County (TW); Jung-Hua Chang, Hsinchu County (TW); Chia-Cheng Ku, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 407 days.

This patent is subject to a terminal disclaimer.

(21) Appl. No.: 17/199,292

(22) Filed: Mar. 11, 2021

(65) Prior Publication Data

US 2022/0106684 A1  Apr. 7, 2022

(30) Foreign Application Priority Data

Oct. 6, 2020 (TW) ................................ 109134658

(51) Int. Cl.
*C23C 16/455* (2006.01)
*C23C 16/44* (2006.01)
*H01L 33/00* (2010.01)

(52) U.S. Cl.
CPC .... *C23C 16/45544* (2013.01); *C23C 16/4417* (2013.01); *H01L 33/00* (2013.01)

(58) Field of Classification Search
None
See application file for complete search history.

(56) References Cited

U.S. PATENT DOCUMENTS

| 3,213,827 | A | * | 10/1965 | Jenkin | C23C 16/44 118/725 |
| 4,810,524 | A | * | 3/1989 | Nakayama | G11B 5/70647 204/170 |
| 5,003,919 | A | * | 4/1991 | Yamamoto | G11B 5/70605 118/716 |
| 11,739,423 | B2 | * | 8/2023 | Lin | C23C 16/4417 118/716 |
| 11,767,591 | B2 | * | 9/2023 | Lin | C23C 16/4417 118/719 |

(Continued)

*Primary Examiner* — Karla A Moore
(74) *Attorney, Agent, or Firm* — Chun-Ming Shih; HDLS IPR SERVICES (57) ABSTRACT

An atomic layer deposition apparatus for coating on fine powders is disclosed, which includes a vacuum chamber, a shaft sealing device, and a driving unit. The shaft sealing device includes an outer tube and an inner tube arranged in an accommodating space of the outer tube. The driving unit drives the vacuum chamber to rotate through the outer tube to agitate the fine powders in a reaction space of the vacuum chamber. An air extraction line and an air intake line are arranged in a connection space of the inner tube. The air extraction line is used to extract gas from the reaction space. The air intake line is used to transport non-reactive gas to the reaction space to blow the fine powders around in the reaction space and precursor gas to the reaction space to form thin films with uniform thickness on the surface of the fine powders.

13 Claims, 7 Drawing Sheets

(56) References Cited

U.S. PATENT DOCUMENTS

| | | | |
|---|---|---|---|
| 11,952,662 B2* | 4/2024 | Lin | C23C 16/4417 |
| 2002/0007795 A1* | 1/2002 | Bailey, III | H01J 37/32522 |
| | | | 118/724 |
| 2002/0112792 A1* | 8/2002 | Kemp | F27B 7/00 |
| | | | 266/172 |
| 2004/0149212 A1* | 8/2004 | Cho | C23C 16/45561 |
| | | | 118/715 |
| 2007/0104860 A1* | 5/2007 | Gleason | C23C 16/4417 |
| | | | 427/248.1 |
| 2009/0011606 A1* | 1/2009 | Shinozaki | C23C 16/482 |
| | | | 438/758 |
| 2011/0003088 A1* | 1/2011 | Honda | B01J 2/12 |
| | | | 118/723 E |
| 2012/0085284 A1* | 4/2012 | Dassel | C01B 33/035 |
| | | | 118/716 |
| 2013/0059073 A1* | 3/2013 | Jiang | C04B 35/62222 |
| | | | 118/715 |
| 2016/0369396 A1* | 12/2016 | Sammelselg | C23C 16/45555 |
| 2022/0106682 A1* | 4/2022 | Lin | C23C 16/4557 |
| 2022/0106685 A1* | 4/2022 | Lin | C23C 16/403 |
| 2022/0106686 A1* | 4/2022 | Lin | C23C 16/4417 |
| 2022/0136103 A1* | 5/2022 | Lin | C23C 16/45544 |
| | | | 118/719 |
| 2022/0162750 A1* | 5/2022 | Lin | C23C 16/4417 |
| 2022/0341036 A1* | 10/2022 | Lin | C23C 16/45525 |
| 2023/0120393 A1* | 4/2023 | Lin | C23C 16/4417 |
| | | | 118/715 |

* cited by examiner

ATOMIC LAYER DEPOSITION APPARATUS FOR COATING ON FINE POWDERS

TECHNICAL FIELD

The present disclosure relates to an atomic layer deposition apparatus for coating on fine powders, more particularly, to an atomic layer deposition apparatus that is capable of spreading fine powders in a reaction space of a vacuum chamber by rotating the vacuum chamber and transporting non-reactive gas to the vacuum chamber, for enhancing a formation of thin films with uniform thickness on the surface of the fine powders.

BACKGROUND

Nanoparticle is generally defined as a particle that is smaller than 100 nanometers in at least one dimension, and in comparison to macroscopic matter, nanoparticle is completely different in both physical and chemical properties. Broadly speaking, the physical property of macroscopic matter is unrelated to its size, but the same cannot be said for nanoparticle. Nanoparticles are currently being studied for potential applications in biomedical, optical, and electronic fields.

For instance, a quantum dot is a semiconductor nanoparticle having a diameter between 2 to 10 nanometers and with optical and electronic properties that differ from larger particles. Electron in the quantum dot absorbs energy after being irradiated by ultra-violet light and transitions from valence band to conductance band. When the stimulated electron returns to the valence band from the conductance band, it releases the energy by emission of light.

The energy gap of a quantum dot is associated to its size, wherein the larger the size of a quantum dot, the smaller the energy gap which in turn emits light with longer wavelength after radiation, and the smaller the size of a quantum dot, the larger the energy gap which in turn emits light with shorter wavelength after radiation. For example, a quantum dot of 5 to 6 nanometers emits orange or red light, whereas a quantum dot of 2 to 3 nanometers emits blue or green light; the light color is, of course, determined by the material composition of the quantum dot.

Since light generated by light emitting diode (LED) that utilizes quantum dots is near continuous spectrum and has good color rendering, which are beneficial in improving the luminous quality of LED, quantum dots have become a main focus in developing the next generation of light-emitting devices and displays.

Although nanoparticles and quantum dots have the aforementioned advantages and properties, agglomeration of the nanoparticles occurs easily during storage, application, and manufacturing process. Moreover, nanoparticles have higher surface activities and are prone to react with air and water vapor, which are factors that shorten the life cycle of nanoparticles.

In particular, agglomeration occurs when the quantum dots are being manufactured as sealant for LED and thereby decreasing the optical performance of quantum dots. Further, after the quantum dots are made as the sealant of LED, it is still possible for surrounding oxygen or water vapor to penetrate through the sealant and come in contact with the surface of the quantum dots, thereby causing the quantum dots to be oxidized and affecting the efficacy or life cycle of the quantum dots and LED. The surface defects and dangling bonds of the quantum dots may also cause non-radiative recombination, which also affects the luminous efficiency of quantum dots.

Atomic layer deposition (ALD) is a process currently used by industries to form a thin film with nanometer thickness or a plurality of thin films on the surface of the quantum dots to form a quantum well.

ALD process can form a thin film with a uniform thickness on a substrate with precision in controlling the thickness of the thin film, and so in theory ALD process could also be applicable to three-dimensioned quantum dots. When the quantum dots sit on a support pedestal, contacts exist between adjacent quantum dots, and these contacts cannot be reached by a precursor gas of ALD. Thus, thin films with uniform thickness cannot be formed on the surface of all nanoparticles.

SUMMARY

To solve the aforementioned issues, the present disclosure provides an atomic layer deposition apparatus for coating on fine powders that is capable of agitating fine powders during the atomic layer deposition (ALD) process such that the fine powders are diffused and spread out in a reaction space of a vacuum chamber, such that the contacts between each powder is decreased/minimized/eliminated so as to allow the coating of a thin film with a uniform thickness on the surface of each fine powder.

An object of the present disclosure is to provide an atomic layer deposition apparatus for coating on fine powders, mainly including a driving unit, a shaft sealing device, and a vacuum chamber, wherein through the shaft sealing device, the driving unit is connected to the vacuum chamber and drives the vacuum chamber to rotate. The shaft sealing device includes an outer tube and an inner tube, wherein the inner tube is disposed in an accommodating space of the outer tube. The driving unit is connected to the vacuum chamber through the outer tube and drives the vacuum chamber to rotate through the outer tube.

The inner tube includes a connection space in which at least one air extraction line, at least one air intake line, at least one non-reactive gas line, at least one heater and/or at least one temperature sensing unit are disposed. The air extraction line is used to extract gas in a reaction space of the vacuum chamber, and the air intake line is used to transport precursor gas and/or non-reactive gas to the reaction space for forming thin films on the surface of the fine powders. The driving unit drives the vacuum chamber to rotate and the air intake line increases the flow of non-reactive gas to the vacuum chamber, to spread the fine powders to all regions in the reaction space so as to decrease contacts between each fine powder, thereby contributing to the formation of a thin film with a uniform thickness on the surface of each fine powder. In addition, when the driving unit drives the outer tube and the vacuum chamber to rotate, the inner tube and the air extraction line, the air intake line and/or the non-reactive gas line in the inner tube stay stationary to stably transport the non-reactive gas and the precursor gas to the vacuum chamber.

An object of the present disclosure is to provide an atomic layer deposition apparatus for coating on fine powders, mainly including a driving unit, a shaft sealing device, and a vacuum chamber, wherein the driving unit is connected to the vacuum chamber through the shaft sealing device. Moreover, a heating device is wrapped around the side surface of the vacuum chamber for heating a reaction space of the vacuum chamber to increase the temperature inside the reaction space. Further, the driving unit drives the vacuum chamber to rotate during the heating process to stir the fine powders in the reaction space completely, such that all of the fine powders in the reaction space have similar temperatures.

An object of the present disclosure is to provide an atomic layer deposition apparatus for coating on fine powders, mainly composed of a driving unit, a shaft sealing device, and a vacuum chamber disposed on a support base, wherein the support base is connected to a mount bracket through at least one connecting shaft and is rotatable relative to the mount bracket with the connecting shaft as axis. When the support base rotates, the driving unit, the shaft sealing device, and the vacuum chamber are driven to rotate, and an inclination angle of the vacuum chamber can be adjusted according to the process requirement to enhance the formation of a thin film with a uniform thickness on the surface of each fine powder.

To achieve the aforementioned objects, the present disclosure provides an atomic layer deposition apparatus for coating on fine powders, which includes a vacuum chamber, a shaft sealing device, a driving unit, at least one air extraction line, and at least one air intake line. The vacuum chamber includes a reaction space for accommodating a plurality of fine powders. The shaft sealing device includes an outer tube and an inner tube, wherein the outer tube has an accommodating space for accommodating the inner tube, and the inner tube has a connection space. The driving unit is connected to the vacuum chamber through the shaft sealing device and, through the outer tube, drives the vacuum chamber to rotate relative to the inner tube. The air extraction line is disposed in the inner tube and is fluidly connected to the reaction space of the vacuum chamber for extracting a gas in the reaction space. The air intake line is disposed in the inner tube and is fluidly connected to the reaction space of the vacuum chamber for transporting a precursor or a non-reactive gas to the reaction space, wherein the non-reactive gas blows the fine powders around in the reaction space.

Preferably, the air intake line includes at least one non-reactive gas line disposed in the inner tube and fluidly connected to the reaction space for transporting the non-reactive gas to the reaction space to blow the fine powders around in the reaction space.

Preferably, the shaft sealing device is a magnetic fluid shaft seal.

Preferably, the atomic layer deposition apparatus further includes at least one gear connected to the driving unit and the outer tube of the shaft sealing device. Through the gear, the driving unit drives the outer tube of the shaft sealing device and the vacuum chamber to rotate relative to the inner tube.

Preferably, the atomic layer deposition apparatus further includes a gear cover for covering the gear.

Preferably, the vacuum chamber includes a cover lid and a chamber. The cover lid has an inner surface covering the chamber to form the reaction space between the cover lid and the chamber, and a monitor wafer is disposed on the inner surface of the cover lid.

Preferably, the atomic layer deposition apparatus further includes an inspection hole disposed on the cover lid.

Preferably, the atomic layer deposition apparatus further includes a filter unit disposed at one end of the inner tube connecting to the reaction space. The gas in the reaction space being extracted by the air extraction line passes through the filter unit.

Preferably, the atomic layer deposition apparatus further includes a heater and a temperature sensing unit disposed in the inner tube. The heater is used to heat the connection space of the inner tube and the reaction space of the vacuum chamber, and the temperature sensing unit is used to measure a temperature of the connection space of the inner tube.

Preferably, the atomic layer deposition apparatus further includes at least one heating device disposed to surround the vacuum chamber for heating the reaction space of the vacuum chamber.

Preferably, the atomic layer deposition apparatus further includes a support base and at least one mount bracket. The support base is used for placing the driving unit, the vacuum chamber, and the shaft sealing device, and is connected to the mount bracket through at least one connecting shaft. The support base is rotatable relative to the mount bracket with the connecting shaft as axis to change an inclination angle of the driving unit, the vacuum chamber, and the shaft sealing device.

Preferably, the inner tube extends from the accommodating space of the outer tube to the reaction space of the vacuum chamber and forms a protruding tube part in the reaction space.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
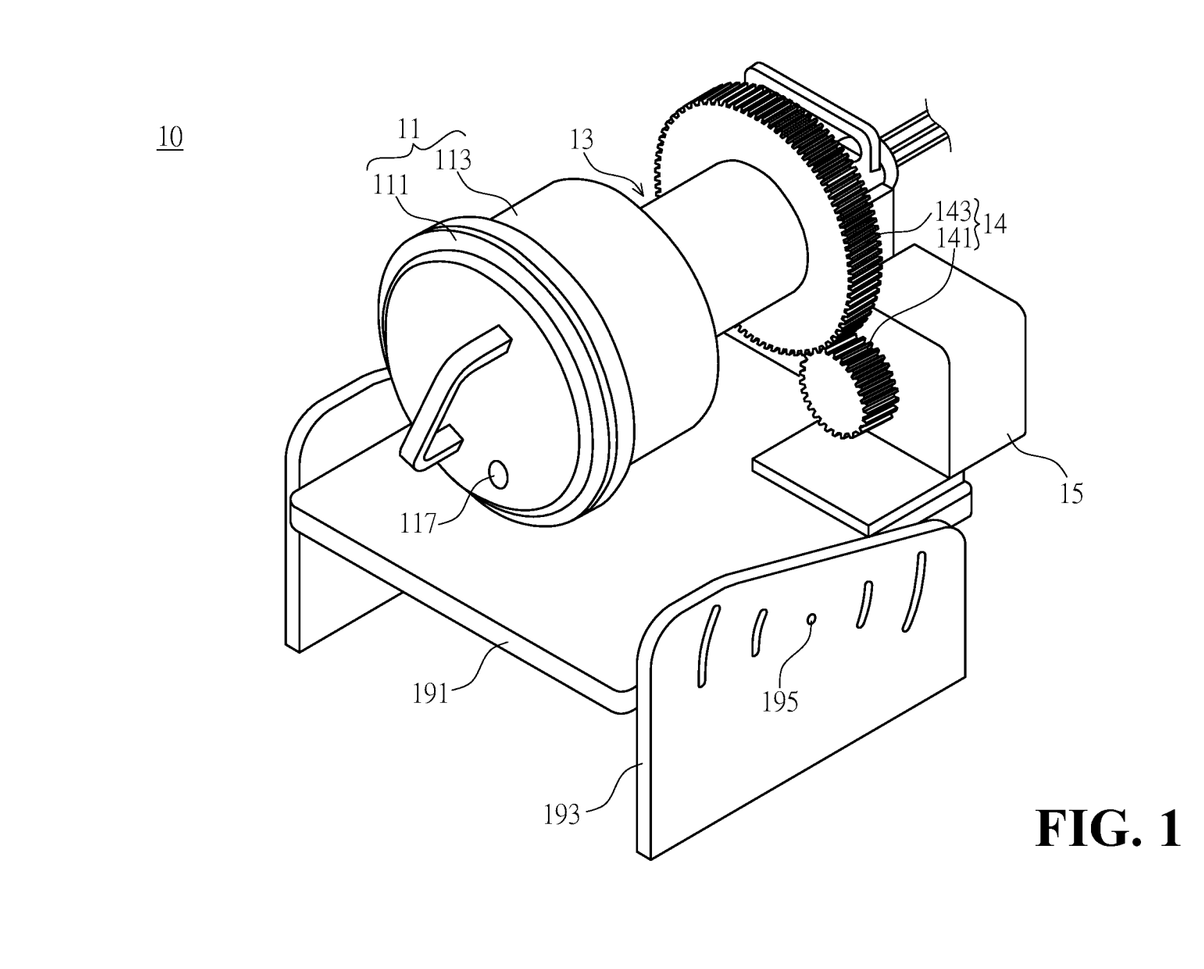
FIG. 1 is a schematic diagram of an atomic layer deposition apparatus for coating on fine powders according to an embodiment of the present disclosure.
Figure 2:
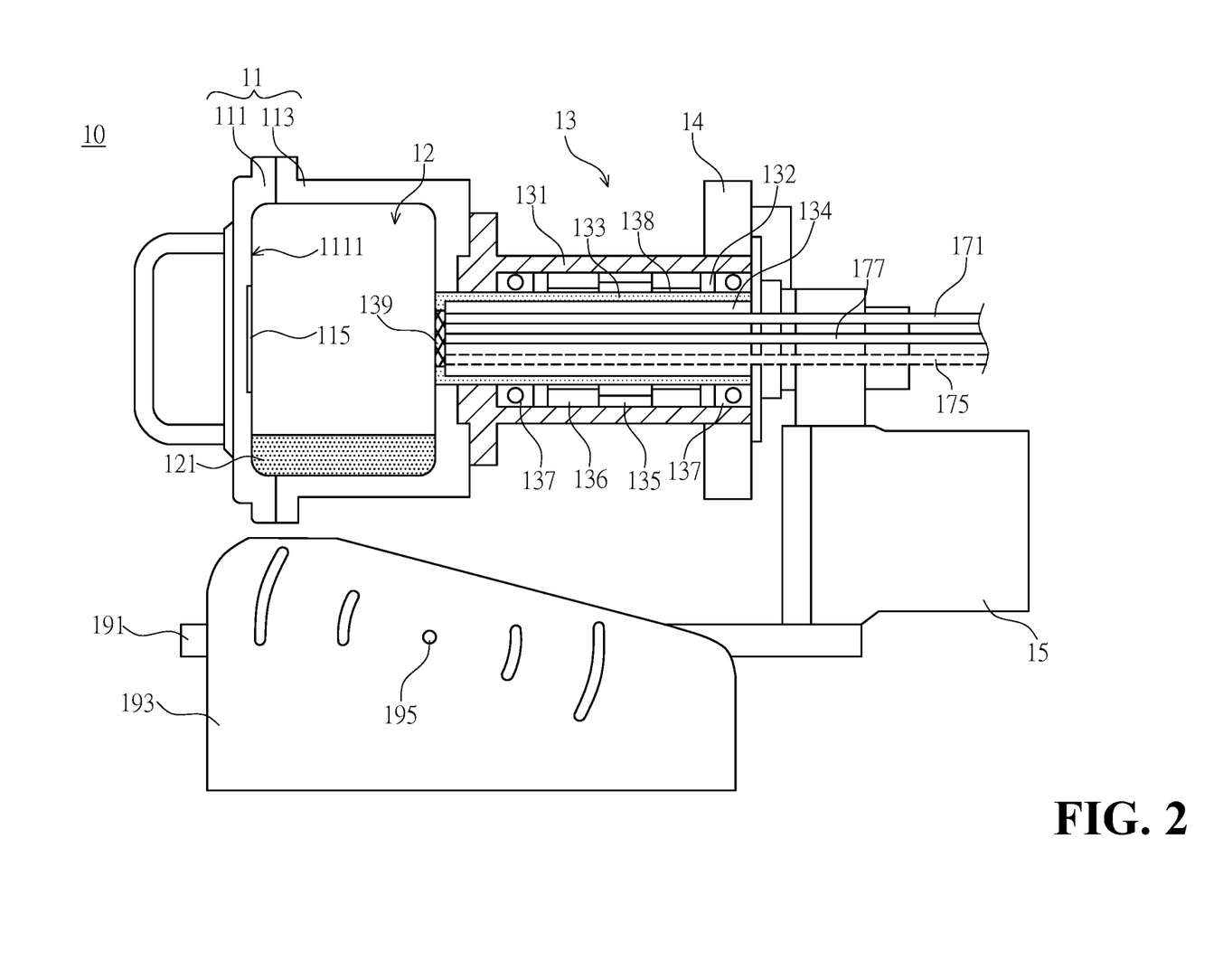
FIG. 2 is a cross-sectional schematic diagram of an atomic layer deposition apparatus for coating on fine powders according to an embodiment of the present disclosure.
Figure 3:
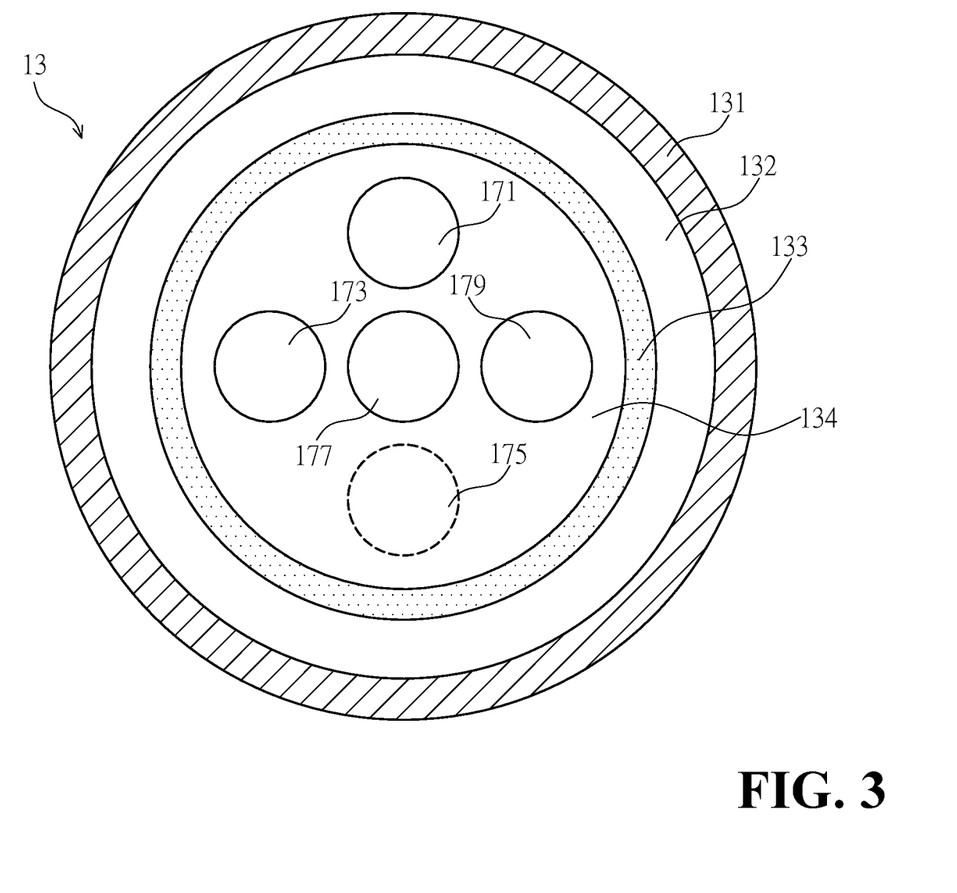
FIG. 3 is a cross-sectional schematic diagram of a partial structure of an atomic layer deposition apparatus for coating on fine powders according to an embodiment of the present disclosure.

Referring to FIG. 1, FIG. 2, and FIG. 3, an atomic layer deposition apparatus 10 for coating on fine powders includes a vacuum chamber 11, a shaft sealing device 13, and a driving unit 15. As shown in the figures, the driving unit 15 is connected to the vacuum chamber 11 through the shaft sealing device 13 and drives the vacuum chamber 11 to rotate.

The vacuum chamber 11 has a reaction space 12 for accommodating a plurality of fine powders 121 such as quantum dots. The quantum dots may be made of semiconductor material like ZnS, CdS, CdSe, etc in groups II~VI, and a thin film formed on each of the quantum dots may be aluminum oxide ($Al_2O_3$). The vacuum chamber 11 includes a cover lid 111 and a chamber 113, wherein an inner surface 1111 of the cover lid 111 is used to cover the chamber 113 so as to form the reaction space 12 between the cover lid 111 and the chamber 113. In addition, an inspection hole 117 can be disposed on the cover lid 111, and a user can observe the fine powders 121 in the reaction space 12 through the inspection hole 117. The inspection hole 117 can be formed on the cover lid 11 by, for example, implementing a through hole on the cover lid 111 and placing a heat-resistance glass on the through hole.

In one embodiment, the atomic layer deposition apparatus 10 for coating on fine powders includes a non-contact type temperature sensor (not shown) facing the inspection hole 117 on the cover lid 111, for measuring the temperature of the fine powders in the reaction space 12. The atomic layer deposition apparatus 10 can further include a temperature sensor (not shown) facing the vacuum chamber 11, for measuring the surface temperature of the vacuum chamber 11. The temperature sensing unit can be a contact type temperature sensor or a non-contact type temperature sensor.

In one embodiment, a monitor wafer 115 is disposed on the inner surface 1111 of cover lid 111, wherein the monitor wafer 115 is positioned inside the reaction space 12 when the cover lid 111 covers the chamber 113. During the ALD process in the reaction space 12, a thin film is formed on the surface of the monitor wafer 115. In practice, the thickness of the thin film formed on the surface of the monitor wafer 115 and the thickness of the thin film formed on the surface of the fine powder 121 can be measured to calculate a relation between the two thin films. Subsequently, the thickness of the thin film formed on the surface of the fine powder 121 can be obtained by measuring the thickness of the thin film formed on the surface of the monitor wafer 115 and converting the measured thickness based on the relation.

In different embodiments, the chamber 113 is made of a light-transmitting material. The cover lid 111 has a polygonal recess or a wavy circular recess disposed on the inner surface 1111, and the chamber 113 has a corresponding polygonal space or a corresponding wavy circular space, wherein the polygonal recess or the wavy circular recess of the cover lid 111 and the polygonal space or the wavy circular space of the chamber 113 form a void with polygonal columnar shape or with wavy circular columnar shape.

The shaft sealing device 13 includes an outer tube 131 and an inner tube 133, wherein the outer tube 131 has an accommodating space 132 and the inner tube 133 has a connection space 134. The outer tube 131 and the inner tube 133 may, for example, be hollow columnar objects. The accommodating space 132 of the outer tube 131 is used to accommodate the inner tube 133, and the outer tube 131 and the inner tube 133 are configured to be coaxial.

In one embodiment, the shaft sealing device 13 is a common shaft seal mainly used for isolating the reaction space 12 of the vacuum chamber 11 from outer spaces to maintain vacuum in the reaction space 12. In another embodiment, the shaft sealing device 13 is a magnetic fluid shaft seal that includes a plurality of bearings 137, at least one permanent magnet 135, at least one pole piece 136, and at least one magnetic fluid 138, and all of which are disposed in the accommodating space 132 between the outer tube 131 and the inner tube 133.

In specific, the bearings 137 are sleeved over the outer surface of the inner tube 133 and are located between the inner tube 133 and the outer tube 131 such that the outer tube 131 is rotatable relative to the inner tube 133. The permanent magnet 135 is disposed on the inner surface of the outer tube 131 between two of the bearings 137. Two pole pieces 136 are disposed on the inner surface of the outer tube 131 and respectively between the permanent magnet 135 and the two respective bearings 137. There is a gap between the pole pieces 136 and the outer surface of the inner tube 133 and the magnetic fluid 138 is disposed in the gap. The aforementioned structure of magnetic fluid shaft seal is merely an embodiment of the present disclosure, and the scope of the present disclosure is not limited thereby.

The driving unit 15 may drive the outer tube 131 and the vacuum chamber 11 to rotate continuously in one direction, like clockwise or counterclockwise. In different embodiments, the driving unit 15 may drive the outer tube 131 and the vacuum chamber 11 to rotate in the clockwise direction by a specific angle, and then in the counterclockwise direction by the specific angle; the angle is, for example, 360 degrees. As the vacuum chamber 11 rotates, the fine powders 121 in the reaction space 12 are stirred and agitated, which in turn helps the fine powders 121 to come in contact with a precursor gas.

In one embodiment, the driving unit 15 is a motor, which is connected to the outer tube 131 through a gear 14, and through the gear 14, drives the outer tube 131 and the vacuum chamber 11 to rotate relative to the inner tube 133. The driving unit 15 may be connected to a first gear 141, and the outer tube 131 may be connected to a second gear 143, wherein the first gear 141 is meshed with the second gear 143. When the driving unit 15 drives the first gear 141 to rotate, the first gear 141 drives the meshed second gear 143, the outer tube 131, and the vacuum chamber 11 to rotate. In one embodiment, the first gear 141 and the second gear 143 are helical gears.

As shown in FIG. 2 and FIG. 3, at least one air extraction line 171, at least one air intake line 173, at least one non-reactive gas line 175, a heater 177 and/or a temperature sensing unit 179 are disposed in the connection space 134 of the inner tube 133.

The air extraction line 171 is fluidly connected to the reaction space 12 of the vacuum chamber 11 and is used to extract gas from the reaction space 12 to create vacuum in the reaction space 12 for subsequent ALD process. In particular, the air extraction line 171 can connect to a pump and use the pump to extract the gas in the reaction space 12.

The air intake line 173 is fluid connected to the reaction space 12 of the vacuum chamber 11 and is used to transport a precursor or a non-reactive gas to the reaction space 12, wherein the non-reactive gas may be a noble gas like nitrogen or argon. The air intake line 173 can, for example, be connected to a precursor storage tank and a non-reactive gas storage tank through a valve set, and through the valve set, transport the precursor gas to the reaction space 12 to form a thin film on the surface of each fine powder 121 in the reaction space 12. In practical application, the air intake line 173 may transport a carrier gas together with the precursor gas to the reaction space 12. Then, the air intake line 173 transports the non-reactive gas to the reaction space 12 to remove the precursor gas in the reaction space 12. In one embodiment, the air intake line 173 is connected to a plurality of branch lines and transports different precursor gases to the reaction space 12 sequentially through the respective branch lines.

The air intake line 173 is also capable of increasing a flow of non-reaction gas delivered to the reaction space 12, so as to blow the fine powders 121 around in the reaction space 12 by the non-reactive gas, such that the fine powders 121 are carried by the non-reactive gas and diffused to various areas and all regions of the reaction space 12.

In one embodiment, the air intake line 173 includes at least one non-reactive gas line 175, wherein the non-reactive gas line 175 is fluid connected to the reaction space 12 of the vacuum chamber 11 and is used to transport a non-reactive gas to the reaction space 12. The non-reactive gas line 175 can, for example, be connected to a nitrogen storage tank through a valve set, and through the valve set, transport the nitrogen to the reaction space 12. The non-reactive gas is used to blow the fine powders 121 around in the reaction space 12, and in combination with the rotating of the vacuum chamber 11 driven by the driving unit 15, the fine powders 121 in the reaction space 12 are effectively and evenly stirred and agitated, thereby contributing in forming a thin film with a uniform thickness on the surface of each fine powder 121.

The air intake line 173 and the non-reactive gas line 175 of the atomic layer deposition apparatus 10 for coating on fine powders are both used to transport non-reactive gas to the reaction space 12. The flow of non-reactive gas transported by the air intake line 173 is smaller as the main purpose of which is for removing the precursor gas in the reaction space 12, whereas the flow of non-reactive gas transported by the non-reactive gas line 175 is larger and is mainly used to blow the fine powders 121 around the reaction space 12. The non-reactive gas transported by the air intake line 173 and by the non-reactive gas line 175 may be the same gas or may be different gases.

More specifically, the timings at which the air intake line 173 and the non-reactive gas line 175 transport the non-reactive gas to the reaction space 12 are different. Hence, the non-reactive gas line 175 may be omitted in practical application, and instead, the flow of non-reactive gas transported by the air intake line 173 is adjusted at different timings. For instance, when removing the precursor gas from the reaction space 12, the flow of non-reactive gas being transported to the reaction space 12 by the air intake line 173 is lowered, and when blowing the fine powders 121 around in the reaction space 12, the flow of non-reactive gas being transported to the reactions space by the air intake line 173 is enlarged.

In one embodiment of the present disclosure, a filter unit 139 is disposed at one end of the inner tube 133 that is connected to the reaction space 12. The air extraction line 171 is fluidly connected to the reaction space 12 through the filter unit 139, and extracts the gas from the reaction space 12 through the filter unit 139. The filter unit 139 is used to filter the fine powders 121 in the reaction space 12 to prevent the fine powders 121 from entering the air extraction line 171 during gas extraction and causing a loss of the fine powders 121.

The air intake line 173 may be fluidly connected to the reaction space 12 through the filter unit 139, and transports the precursor gas or the non-reactive gas to the reaction space 12 through the filter unit 139. Also, the non-reactive gas line 175 may be fluidly connected to the reaction space 12 through the filter unit 139, and transports the non-reactive gas to the reaction space 12 through the filter unit 139. Since the air intake line 173 and the non-reactive gas line 175 are used to transport gas to the reaction space 12, not to extract gas from the reaction space 12, and that the fine powders 121 in the reaction space 12 are less likely to enter the air intake line 173 and the non-reactive gas line 175, the air intake line 173 and the non-reactive gas line 175 can transport gas to the reaction space 12 directly without going through the filter unit 139.

The heater 177 is used to heat the connection space 134 and the inner tube 133. By heating the air extraction line 171, the air intake line 173 and/or the non-reactive gas line 175 in the inner tube 133 with the heater 177, temperatures of the gases in the air extraction line 171, the air intake line 173 and/or the non-reactive gas line 175 are increased. For example, the temperature of non-reactive gas and/or the precursor gas transported by the air intake line 173 to the reaction space 12 may be increased, and the temperature of non-reactive gas transported by the non-reactive gas line 175 to the reaction space 12 may be increased. As such, when the non-reactive gas and/or the precursor gas enter the reaction space 12, the temperature of the reaction space 12 would not drop or change drastically. Moreover, a temperature sensing unit 179 is used to measure the temperature of the heater 177 or the connection space 134 to monitor an operation status of the heater 177. Additional heating device 21 is also often disposed inside of, outside of, or surrounding the vacuum chamber 11, wherein the heating device 21 is adjacent to or in contact with the vacuum chamber 11 for heating the vacuum chamber 11 and the reaction space 12.

When the driving unit 15 drives the outer tube 131 and the vacuum chamber 11 to rotate, the inner tube 133 and the air extraction line 171, the air intake line 173 and/or the non-reactive gas line 175 in the inner tube 133 stay stationary to stably transport the non-reactive gas and the precursor gas to the vacuum chamber 11.

In one embodiment, the atomic layer deposition apparatus 10 for coating on fine powders further includes a support base 191 and at least one mount bracket 193, wherein the support base 191 is a board body for placing the driving unit 15, the vacuum chamber 11, and the shaft sealing device 13. The support base 191 is connected to the driving unit 15, and is connected to the shaft sealing device 13 and the vacuum chamber 11 through the driving unit 15. The shaft sealing device 13 and/or the vacuum chamber 11 can also be connected to the support base 191 through at least one support member so as to enhance the stability of connection.

The support base 191 is connected to the mount bracket 193 through at least one connecting shaft 195, wherein the number of mount brackets 193 is two and the two mount brackets 193 are respectively disposed at two sides of the support base 191. The support base 191 is rotatable relative to the mount brackets 193 with the connecting shaft 195 as axis, so as to change an inclination angle of the driving unit 15, the shaft sealing device 13, and the vacuum chamber 11, and in turn assist in the formation of a thin film with a uniform thickness on the surface of each fine powder 121.

Figure 4:
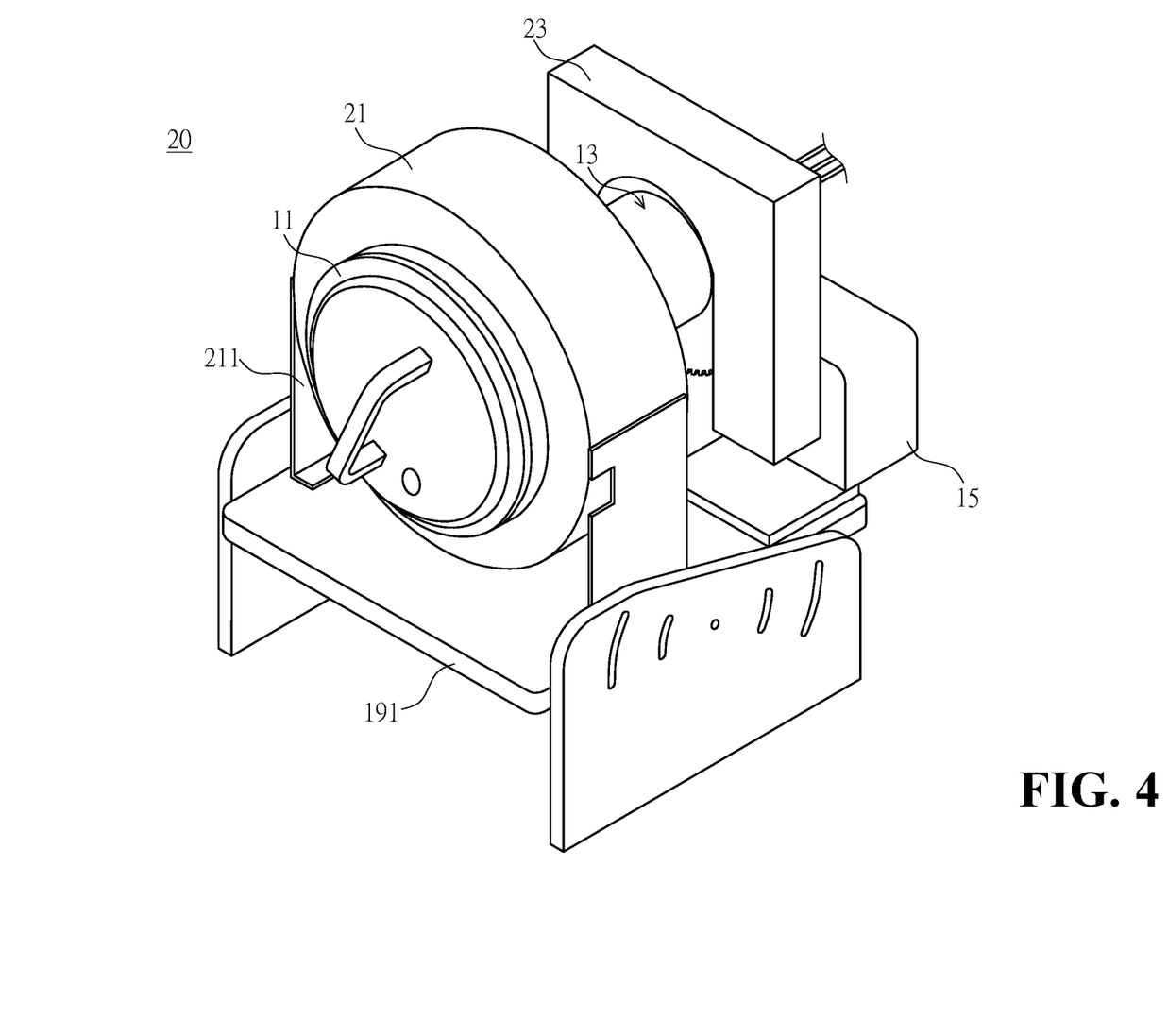
FIG. 4 is a schematic diagram of an atomic layer deposition apparatus for coating on fine powders according to another embodiment of the present disclosure.
Figure 5:
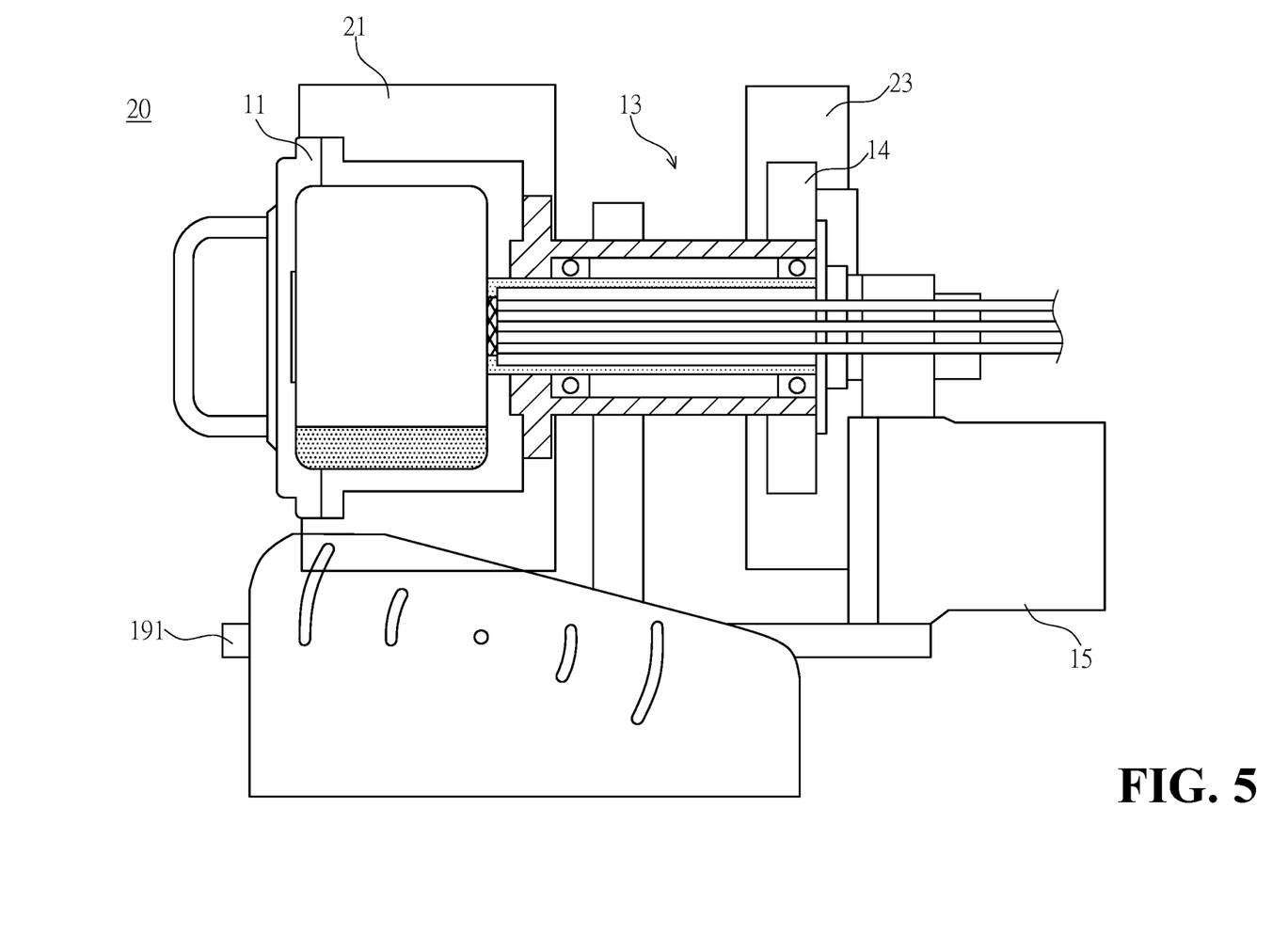
FIG. 5 is a cross-sectional diagram of an atomic layer deposition apparatus for coating on fine powders according to another embodiment of the present disclosure.

Referring to FIG. 4 and FIG. 5, an atomic layer deposition apparatus 20 for coating on fine powders includes a vacuum chamber 11, a shaft sealing device 13, a driving unit 15, a heating device 21, and a gear cover 23, wherein the driving unit 15 is connected to the vacuum chamber 11 through the shaft sealing device 13 and drives the vacuum chamber 11 to rotate.

The heating device 21 is disposed to surround the side surface of the vacuum chamber 11 and is used to heat the vacuum chamber 11 and the reaction space 12. In one embodiment, the heating device 21 is connected to the support base 191 through a connecting bracket 211, and the driving unit 15 drives the vacuum chamber 11 to rotate relative to the heating device 21.

The gear cover 23 is used to cover the gear 14 for avoiding external contamination source contacting the gear and for preventing injuries of workers from accidentally touching the rotating gear 14 in operation. The gear cover 23 is designed to be detachable, so that the gear cover 23 can be taken down during maintenance or repair.

Figure 6:
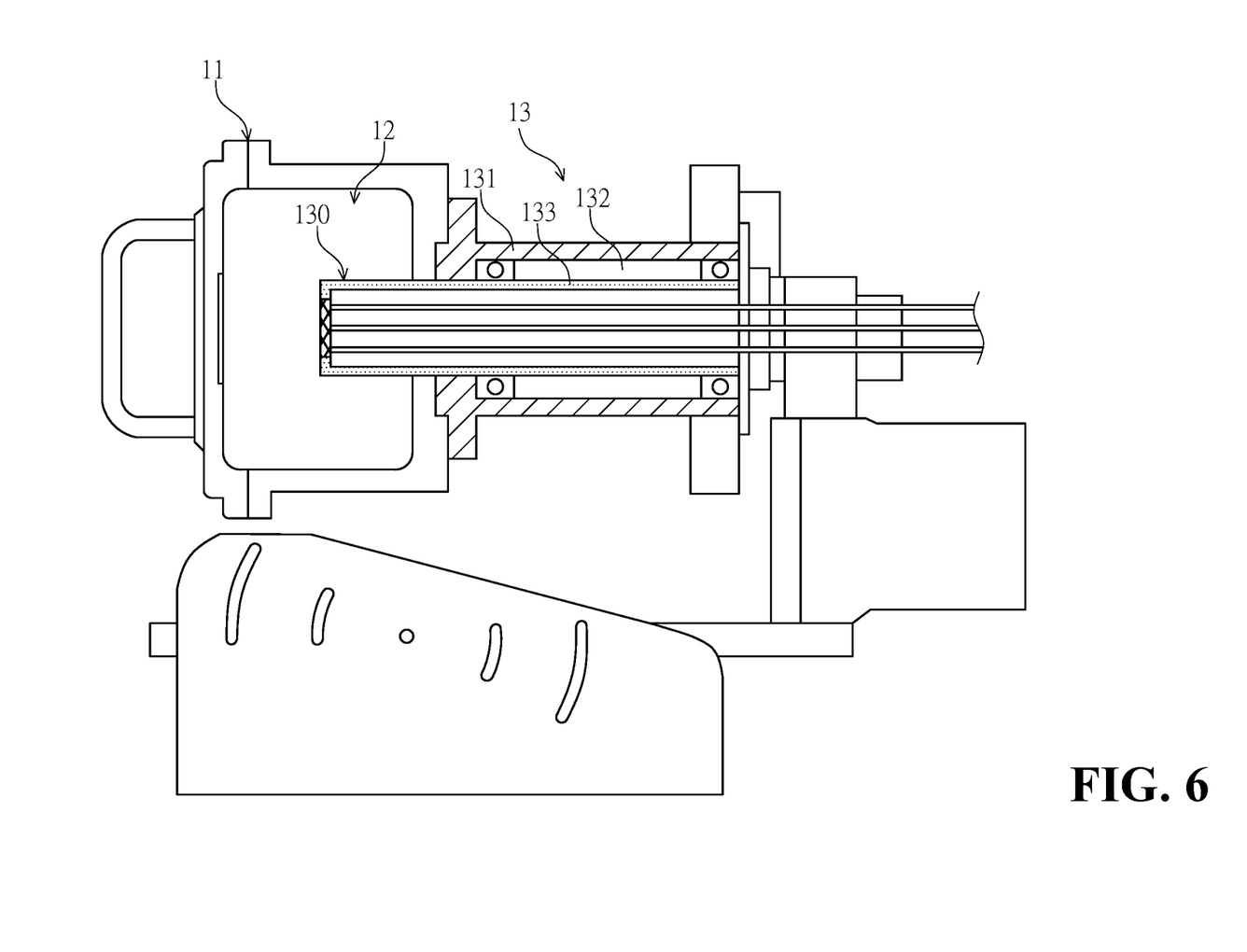
FIG. 6 is a cross-sectional schematic diagram of an atomic layer deposition apparatus for coating on fine powders according to another embodiment of the present disclosure.

In the aforementioned embodiment, the end of the inner tube 133 of the shaft sealing device 13 connecting to the reaction space 12 is flush with the inner surface of the vacuum chamber 11. In practical application, the inner tube 133 extends from the accommodating space 132 of the outer tube 131 to the reaction space 12 of the vacuum chamber 11, forming a protruding tube part 130 in the reaction space 12 as shown in FIG. 6.

Figure 7:
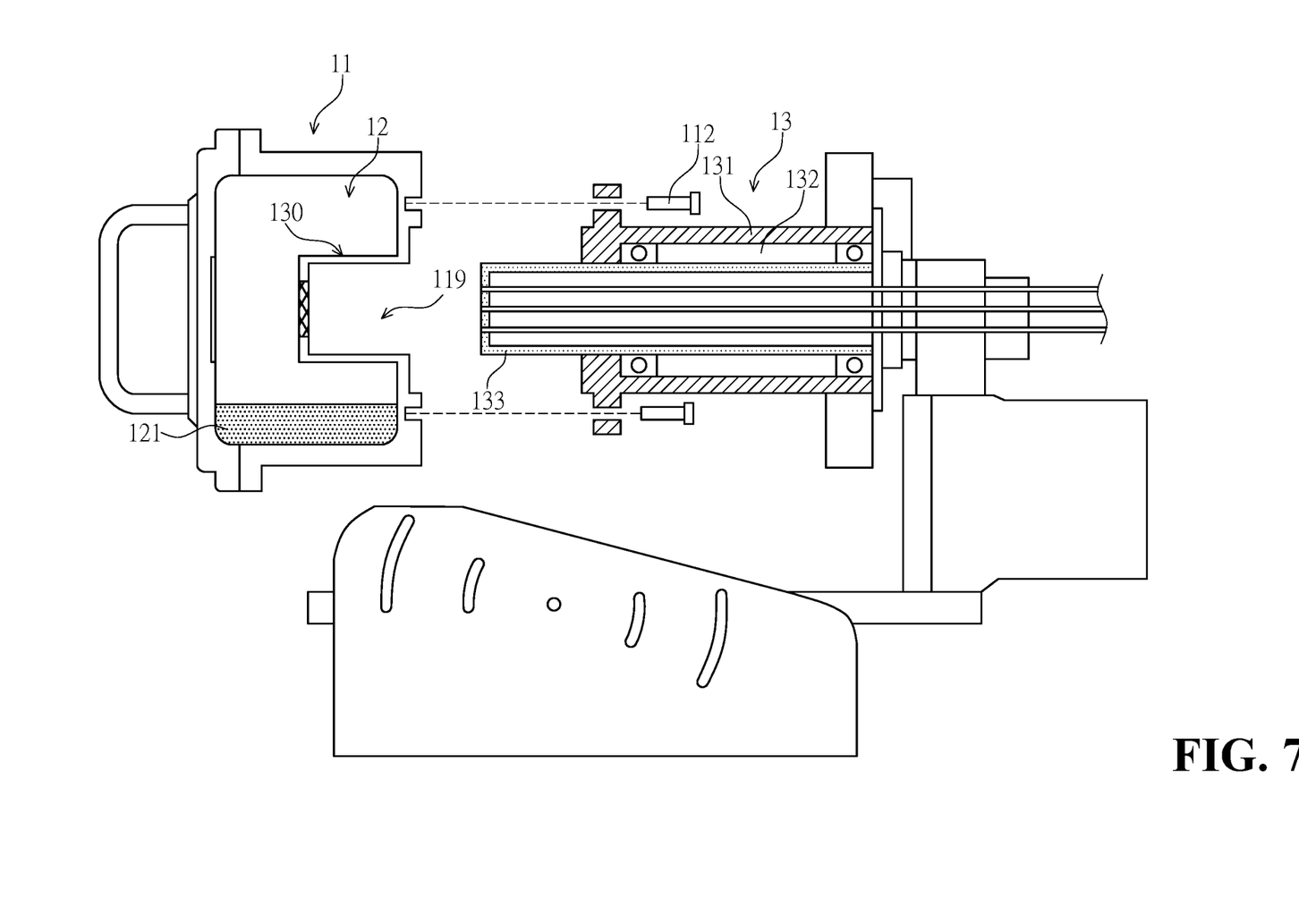
FIG. 7 is a cross-sectional exploded diagram of an atomic layer deposition apparatus for coating on fine powders according to another embodiment of the present disclosure.

Referring to FIG. 7, the vacuum chamber 11 is connected to and fixed to one end of the shaft sealing device 13 through at least one fixing member 112 such as screws. The fixing member 112 being a screw is merely an example of the present disclosure, and in practice the vacuum chamber 11 may be fixed to the shaft sealing device 13 through the fixing member 112 of any formation. For example, the vacuum chamber 11 and the shaft sealing device 13 may be connected by a detachable fixing member 112 like a cylinder connector, a locking/snap mechanism, a latch, a fast-release device, screw threads, etc.

In one embodiment, the vacuum chamber 11 has a recess 119 disposed on a bottom 117 of the vacuum chamber 11 for accommodating a part of the shaft sealing device 13, and the filter unit 139 is disposed in the recess 119, wherein the bottom 117 of the vacuum chamber 11 faces the cover lid 111. The recess 119 extends from the bottom 117 of the vacuum chamber 11 to the reaction space 12, and the inner tube 133 of the shaft sealing device 13 extends from the accommodating space 132 of the outer tube 131 to the outside and protrudes from the shaft sealing device 12 and the outer tube 131. When the vacuum chamber 11 and the shaft sealing device 13 are being connected, the part of the inner tube 133 protruding from the shaft sealing device 13 is inserted into the recess 119 so that the inner tube 133 and the recess 119 form the protruding tube part 130 in the reaction space 12.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. An atomic layer deposition apparatus for coating on fine powders, comprising:
   a vacuum chamber, comprising a reaction space for accommodating a plurality of fine powders;
   a shaft sealing device, comprising an outer tube and an inner tube, wherein the outer tube comprises an accommodating space for accommodating the inner tube, and the inner tube comprises a connection space;
   a driving unit, connected to the vacuum chamber through the outer tube of the shaft sealing device, for driving the vacuum chamber to rotate relative to the inner tube through the outer tube;
   at least one air extraction line, disposed in the connection space of the inner tube and fluidly connected to the reaction space of the vacuum chamber, for extracting a gas from the reaction space;
   at least one air intake line, disposed in the connection space of the inner tube and fluidly connected to the reaction space of the vacuum chamber, for transporting a precursor or a non-reactive gas to the reaction space, wherein the non-reactive gas blows the fine powders around in the reaction space; and
   at least one mount bracket and a support base connected to the mount bracket through at least one connecting shaft;
   wherein the driving unit, the vacuum chamber, and the shaft sealing device are disposed on the support base, and the support base rotates relative to the mount bracket with the connecting shaft as axis to change an inclination angle of the driving unit, the vacuum chamber, and the shaft sealing device;
   wherein when the driving unit drives the outer tube and the vacuum chamber to rotate, the inner tube, the at least one air extraction line in the connection space of the inner tube, and the at least one air intake line in the connection space of the inner tube stay stationary.

2. The atomic layer deposition apparatus of claim 1, wherein the air intake line comprises at least one non-reactive gas line disposed in the connection space of the inner tube and fluidly connected to the reaction space of the vacuum chamber, for transporting the non-reactive gas to the reaction space of the vacuum chamber to blow the fine powders around in the reaction space; wherein when the driving unit drives the outer tube and the vacuum chamber to rotate, the at least one non-reactive gas line in the connection space of the inner tube stays stationary.

3. The atomic layer deposition apparatus of claim 1, wherein the shaft sealing device is a magnetic fluid shaft seal.

4. The atomic layer deposition apparatus of claim 3, further comprising:
   at least one gear, connected the driving unit and the outer tube of the shaft sealing device, wherein the driving unit drives the outer tube of the shaft sealing device and the vacuum chamber to rotate relative to the inner tube through the gear.

5. The atomic layer deposition apparatus of claim 1, wherein the inner tube extends from the accommodating space of the outer tube into the reaction space of the vacuum chamber and forming a protruding tube part in the reaction space.

6. The atomic layer deposition apparatus of claim 1, wherein the vacuum chamber comprises a cover lid, a chamber, and a monitor wafer, an inner surface of the cover lid covers the chamber to form the reaction space between the cover lid and the chamber, and the monitor wafer is disposed on the inner surface of the cover lid.

7. The atomic layer deposition apparatus of claim 6, further comprising an inspection hole disposed on the cover lid.

8. The atomic layer deposition apparatus of claim 7, further comprising a non-contact type temperature sensor facing the inspection hole on the cover lid for measuring a temperature inside the reaction space.

9. The atomic layer deposition apparatus of claim 8, further comprising a temperature sensor facing the vacuum chamber for measuring a temperature on a surface of the vacuum chamber.

10. The atomic layer deposition apparatus of claim 6, wherein the chamber is made of a light-transmitting material.

11. The atomic layer deposition apparatus of claim 1, further comprising:
    a filter unit, disposed at one end of the inner tube connecting to the reaction space, wherein the gas extracted from the reaction chamber by the air extraction line passes through the filter unit.

12. The atomic layer deposition apparatus of claim 1, wherein the vacuum chamber is fixed to the shaft sealing device through at least one fixing member, and the vacuum chamber separates from the shaft sealing device when the fixing member is dislodged.

13. The atomic layer deposition apparatus of claim 12, wherein the vacuum chamber comprises a recess disposed on a bottom of the vacuum chamber for accommodating a part of the shaft sealing device.

* * * * *